United States Patent [19]

Sepponen

[11] Patent Number: 5,592,084

[45] Date of Patent: Jan. 7, 1997

[54] METHOD FOR IMAGING OF MOVEMENT OF MATERIAL

[75] Inventor: Raimo E. Sepponen, Helsinki, Finland

[73] Assignee: Picker Nordstar Inc., Helsinki, Finland

[21] Appl. No.: 158,990

[22] Filed: Nov. 30, 1993

[30] Foreign Application Priority Data

Dec. 1, 1992 [FI] Finland .................................. 925465

[51] Int. Cl.$^6$ .............................. G01V 3/00; G01V 3/14; A61B 5/0265; A61B 5/055
[52] U.S. Cl. .......................... 324/306; 324/307; 324/309; 128/653.3
[58] Field of Search ..................................... 324/306, 307, 324/309; 128/653.3

[56] References Cited

U.S. PATENT DOCUMENTS

| | | | |
|---|---|---|---|
| 4,070,611 | 1/1978 | Ernst | 324/0.5 A |
| 4,668,904 | 5/1987 | Kupiainen | 323/350 |
| 4,699,148 | 10/1987 | Gyngell | 128/653 |
| 4,707,658 | 11/1987 | Frahm et al. | 324/309 |
| 5,122,748 | 6/1992 | Oh et al. | 324/309 |
| 5,151,655 | 9/1992 | Harms | 324/309 |
| 5,262,724 | 11/1993 | Tanttu | 324/309 |
| 5,348,012 | 9/1994 | Kojima | 324/306 X |

OTHER PUBLICATIONS

Cline et al., Volume Rendering and Connectivity Algorithms for MR Angiography, Magn. Res. in Med. 18, 384–394 (1991).

Matsuda et al., Direct T–O–F NMR Angiography within 4s, Magn. Res. in Med. 18, 395–404 (1991).

Uncertified copy of Finland Patent No. 78359, Method for Determination of the Movement of an Object or the Local Distribution of a Flow in the Object.

Buxton et al., Signal Intensity in Fast NMR Imaging with Short Repetition Times, J. of Mag. Res. 83, 576–585 (1989).

J. Tanttu; Koelaitteisto NMR–kuvausta varten Master of Sci. thesis, Helsinki Tech. Univ., Dept. of Tech. Physics, 1982, p. 69 (Non–Certified English Translation Attached).

Dixon et al., Multiple Inversion Recovery Reduces Static Tissue in Angiograms, Mag. Res. in Med. 18, 257–268 (1991).

Mostbeck et al., MR Measurement of Blood Flow in the Cardiovascular System, AJR 159;453–461, Sep. 1992.

*Primary Examiner*—Sandra L. O'Shea
*Assistant Examiner*—Mack Haynes
*Attorney, Agent, or Firm*—T. B. Gurin; J. J. Fry

[57] ABSTRACT

The invention relates to a method for examination of motion of material employing magnetic resonance imaging methods. A magnetic field, which is referred as an auxiliary field is applied over the first area of the object, this auxiliary field is arranged to get smaller as one moves from the first area to the second area, referred as the area to be examined. Partially simultaneously with the auxiliary field a radio frequency pulse, AHP-pulse, is applied on the object, the frequency of the AHP-pulse is the Larmor-frequency corresponding to the strength of the magnetic field in the area to be examined. The length of the AHP-pulse corresponds to the time, which is required for the material to move from the first area to the area to be examined.

9 Claims, 4 Drawing Sheets

METHOD FOR IMAGING OF MOVEMENT OF MATERIAL

The present invention relates to an imaging method based on nuclear magnetic resonance for the examination of motion, e.g. flow of a fluid in e.g. a human or animal body or industrial process.

Magnetic resonance imaging (MRI) is a method which utilizes the nuclear magnetic resonance phenomenon (NMR) for finding out the local distributions of the nuclear density and nucleus related NMR properties of an object or the physical and chemical characteristics having an effect thereon. Such NMR properties include e.g.: longitudinal relaxation (characterized by longitudinal relaxation time T1), transverse relaxation (characterized by transverse relaxation time T2), relaxation in a rotating frame (characterized by relaxation time T1rho), chemical shift, coupling factors between the nuclei. NMR properties are effected by physical phenomena e.g. flow rate, diffusion, paramagnetic materials, ferromagnetic materials, viscosity and temperature.

Methods and applications of magnetic resonance and magnetic resonance imaging have been described in a number of references: Wehrli F. W., Shaw D. Kneeland B. J.: Biomedical Magnetic Resonance Imaging, VCH Publishers Inc., New York 1988, Stark D. D. and Bradley W. G.: Magnetic Resonance Imaging, C. V. Mosby Comp., St. Louis 1991, Abragam A: The principles of nuclear magnetism, Clarendon press, Oxford 1961, Farrar T. C., Becker E. D.: Pulse and Fourier Transform NMR, Academic Press, New York 1971, Ernst R. R.: U.S. Pat. No. 4,070,611.

In reference Kupiainen J: U.S. Pat. No. 4,668,904 there has been described fast, controllable current sources which are needed in MRI experiments.

Imaging sequences having a small sc. excitation angle and the spin echo formed by means of gradient operations are described e.g. in references Frahm J., Haase A., Matthaei D., Haenicke W., Merboldt K-D: U.S. Pat. No. 4,707,658 and Cygnell M. L.: 4,699,148, earlier in references Tanttu J.: Koelaitteisto NMR-kuvausta varten (Experimental apparatus for NMR-imaging, Master of Science thesis, Helsinki Technical University, Department of Technical Physics, 1982, page 69 and Pohjonen J.: Koelaitteisto liikkuvan kohteen NMR-kuvausta varten (Experimental apparatus for NMR-imaging of a moving object, Licenciate thesis, Helsinki Technical University, Department of Technical Physics, 1984, pp. 39–40.

The contrast in images formed by these imaging sequences is discussed e.g. in a reference Buxton R. B., Pisel C. R., Chien D., Brady T. J.: Signal intensity in fast NMR imaging with short repetition times, J. Magn. Reson. vol. 83, pp. 576–585, 1989.

NMR techniques for flow imaging have been discussed e.g. in references Mostbeck G. H., Caputo G. R., Higgins C. B.: MR measurement of blood flow in the cardiovascular system, AJR, vol. 159, pp. 453–461, 1992.

The drawback in the prior art technology is e.g. the artifactual effect of the signal emitted by the static material. It has been tried to reduce this effect e.g. in a case of imaging of blood flow by e.g. suppressing the nuclear magnetization of static tissue, or by using inversion pulses and magnetization transfer. The selective saturation or chemical shift imaging techniques have been employed for the suppression of the signal from fatty tissue. A spatially selective saturation technique for flow imaging has been described e.g. in the reference Sepponen RE: FI pat. 78359. The use of inversion pulses and magnetization transfer has been described e.g. in the reference Tanttu JI: FI pat. 86505. The use of several inversion pulses in order to suppress the signal from static tissue has been described in the reference Dixon W. T., Sardashti M., Castillo M., Stomp G. P.: Multiple inversion recovery reduces static tissue signal in angiograms, Magn. Res. Med., Vol. 18, pp. 257–268, 1991. The suppression of static tissue signal with saturation pulses has been discussed e.g. in the reference: Matsuda T., Doyle M., Pohost G. M.: Direct projective Time-Of-Flight angiography within 4 s, Magn Res. Med., vol. 18, pp. 395–404, 1991. The algorithms which may be applied in reconstruction of the final image have been described e.g. in the reference: Cline H. E., Dumoulin C. L., Lorensen W. E., Souza S. P., Adanms W. J.: Volume rendering and connectivity algorithms for MR angiography, Magn. Res. Med., vol. 18, pp. 384–394, 1991.

Among other things the phase information, selective saturation or a combination of both have been exploited for the discrimination of flowing fluid from static tissues. The drawbacks of these methods are their sensitivity for a turbulence of flow, the artifacts generated by curvatures of vessels and their dependence on the flow rate. During the applications of the methods based on saturation one saturates also more or less the magnetization of the moving material. The resulting poor signal-to-noise ratio increases the imaging time and limits the attainable resolution.

The invention set forth in the patent claim 1 and annexed claims, which describe a method and an apparatus for the use of the method, is capable of eliminating the drawbacks of the prior art.

The invention is illustrated in the accompanying drawings, in which

Figure 1:
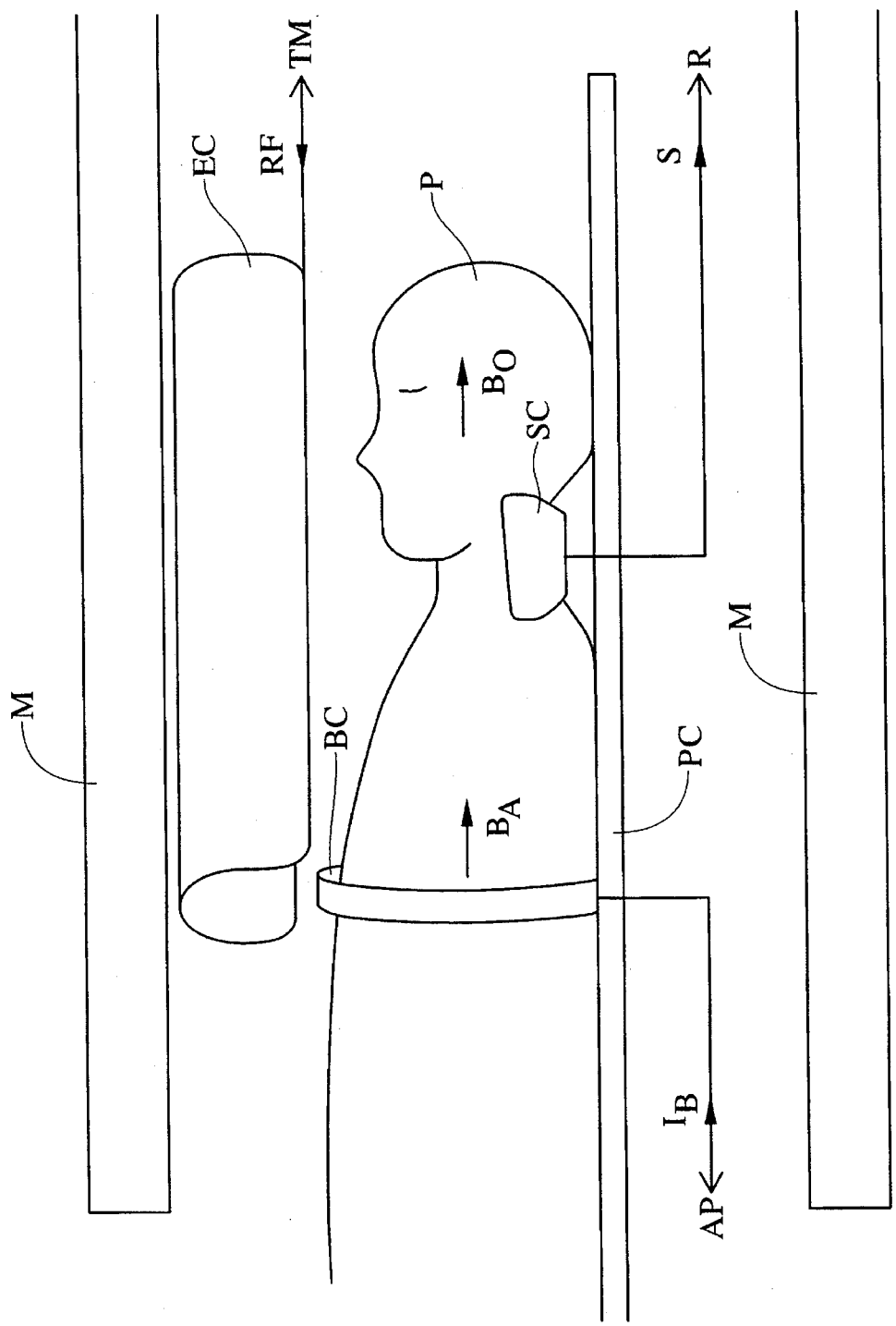
FIG. 1 shows an apparatus which is needed for the use of the inventive method.

The operation of one method of the invention may be described as follows:

FIG. 1 shows some of the components of an MRI unit, which are needed for the application of a method of the invention: M is a magnet which generates a spatially homogenous magnetic field $B_o$, EC is the transmission coil needed in the application of an excitation pulse for the generation of an NMR signal, EC is connected to the transmitter TM of the imaging device, TM generates the required radio frequency pulses RF. A signal coil SC has been placed near the area of the object P to be examined and positioned on a bed PC. The NMR signal S is induced in SC which is connected to receiver R. In addition there is a auxiliary magnet coil BC, which generates an auxiliary magnetic field BA. BC is connected to a controlled current source AP which supplies the desired current $I_B$. For the sake of clarity the required gradient coil system has not been included in the figure. The gradient coil system is often integrated in the structure of the magnet M and which naturally is needed for realization of the methods and apparatus of the invention.

Figure 2:
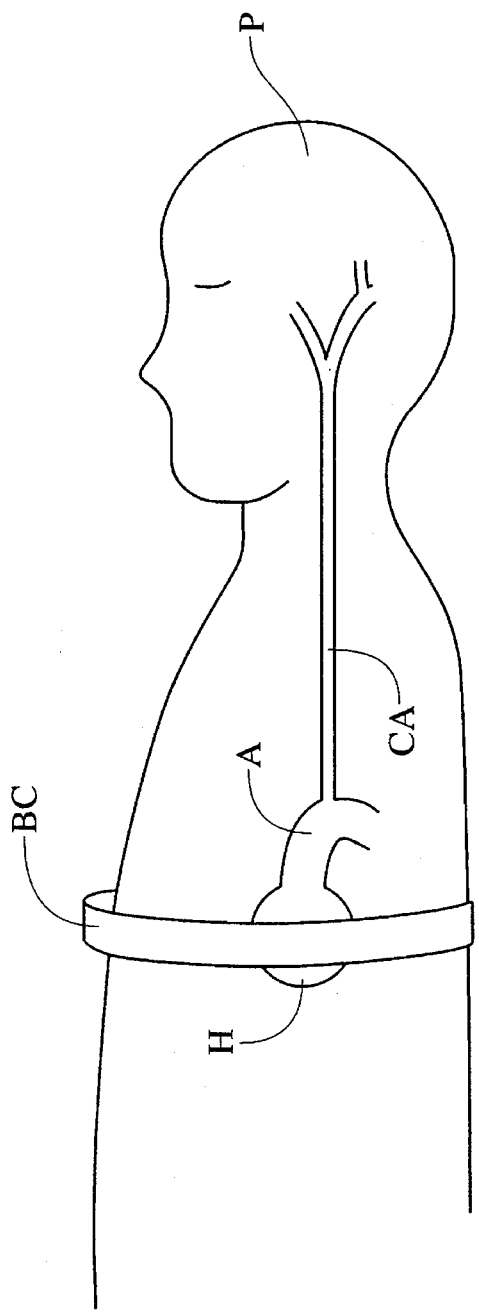
FIG. 2 shows an experimental setting for imaging e.g. carotid arteries.
Figure 2:
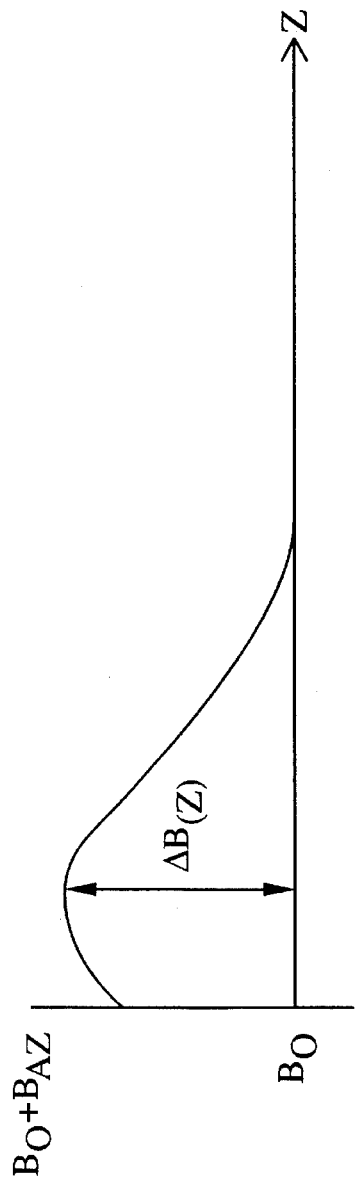

In FIG. 2 a person P acts as an object, BC is placed near the heart H of P, from H extends the aorta A from which the carotid artery CA is bifurcated. In addition there is presented in the FIG. 2 the component of the as a vector sum of $B_o$ and $B_A$ resulting magnetic field which is directed along the axis of the magnet i.e. along the z-axis as a function of the position on the z-axis. As may be noticed in the center of BC the resulting field $B_A+B_o$ is at its strongest and gets weaker towards the head of P. The difference between the resultant $B_o+B_A$ and $B_o$ as a function of the position on the z-axis is denoted as /delta/B(z). BC has been realized so that the field generated by BC reduces faster than proportionally to the third power of the distance from the center of BC. Then the field generated by BC is less than 10% of the field in the center of BC.

The sequence of operations of a method of the invention is presented in FIG. 3. In this, as an example, presented case the operations are synchronized with the electrical function of the heart of P, this is presented on the axis EKG. This synchronization utilizes the QRS-complex which is related to the contraction of the left ventricle. $B_c$ is to be switched on either before the QRS complex or triggered by the QRS complex. After the field generated by $B_c$ has reached the preset value the radio frequency pulse at the Larmor frequency corresponding to $B_o$ is applied as visualized with the RF-axis in the figure. After $T_B$ $B_C$ is switched off and thereafter the frequency of the radio frequency pulse is increased and its amplitude is decreased towards zero, this takes place during $T_{SW}$. These operations are followed by the imaging period $T_{SC}$, during which the target area is imaged with a sequence, which corresponds e.g. to the sequence described in the reference U.S. Pat. No. 4,707,658. In the FIG. 3 /alpha/ is the excitation angle, $G_S$ is the slice selection gradient, $G_p$ is the phase encoding gradient and $G_R$ is the read gradient, S is the signal and SE is the spin echo which is registered and stored. A sequence like this is not very sensitive to turbulence of flow and on the other hand because the imaging operations take place during the diastole the amount of turbulence is as small as possible.

The direction of the effective field $B_{eff}$ which is applied over a nucleus moving with the blood flow from H, as the nucleus proceeds from the heart to the carotid artery of P. As /delta/ $B_z$ is very small in the area of the carotid artery is $B_{eff}$ nearly orthogonal to the z-direction. $B_{eff}$ is generated by applying on P simultaneously a magnetic field oscillating at the Larmor frequency which corresponds to the strength of $B_o$. It may be noted that the magnetization $M_n$ of the population or nuclei experiences an adiabatic half passage AHP which tilts the direction of $M_n$ 90° in respect to the z-direction. The principle of AHP is described in detail in the reference Abragam A. which is mentioned above. The amplitude of the oscillating magnetic field much be high enough so that the magnetic moments of nuclei stay locked. A suitable value could be 0.1 mT. The maximum amplitude of /delta/$B_z$ may be 0.3 mT.

Figure 3A:
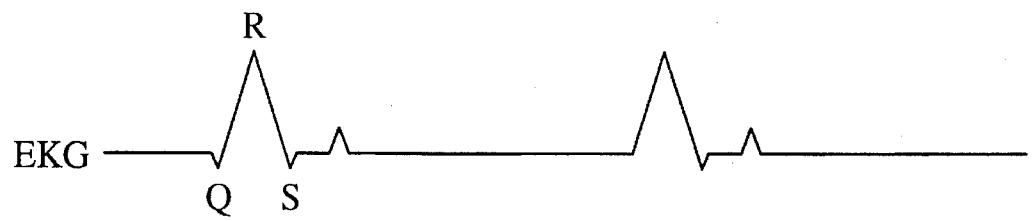
FIG. 3 shows one sequence of operations of the invention
Figure 3A:
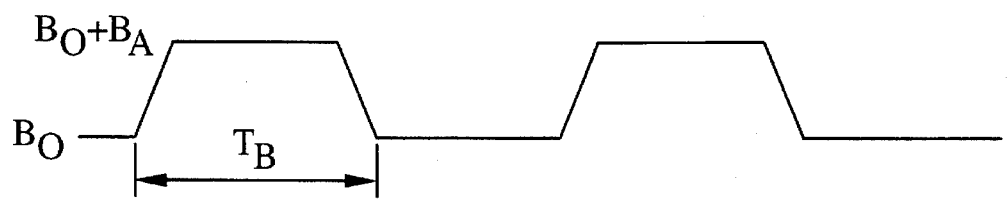
Figure 3A:
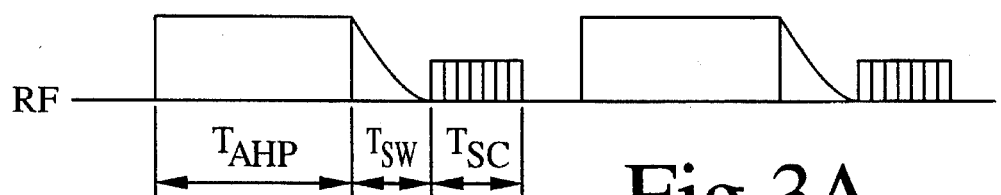
Figure 3B:
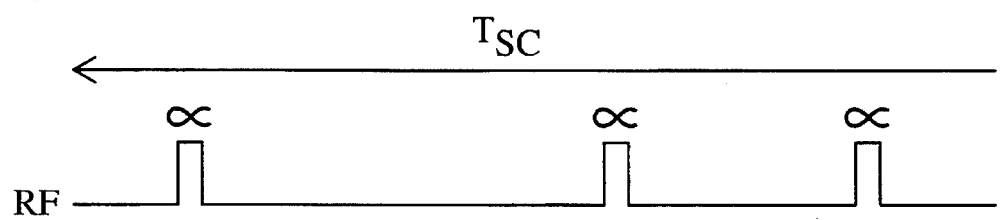
Figure 3B:
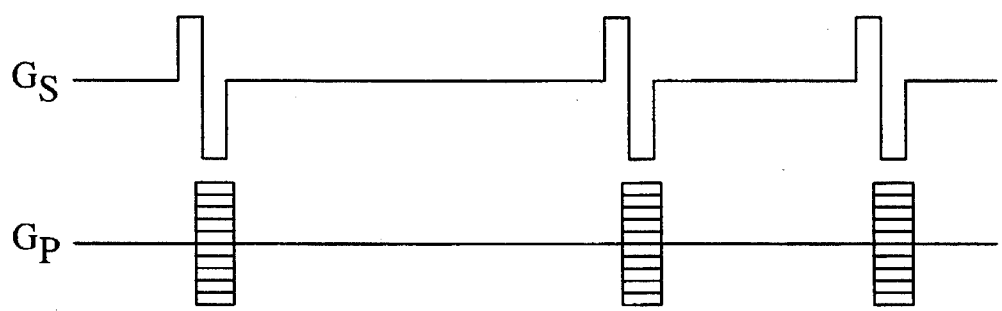
Figure 3B:
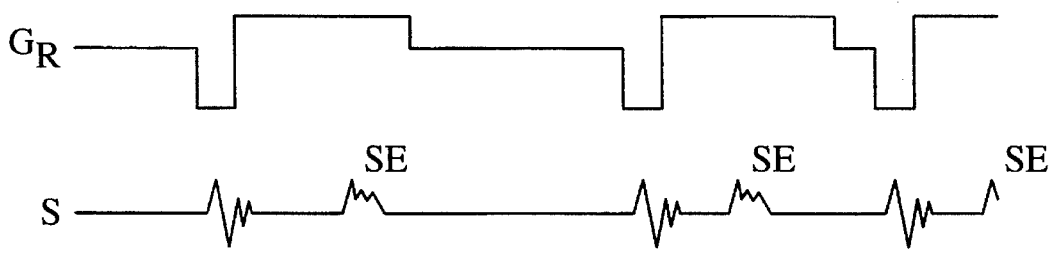
Figure 4:
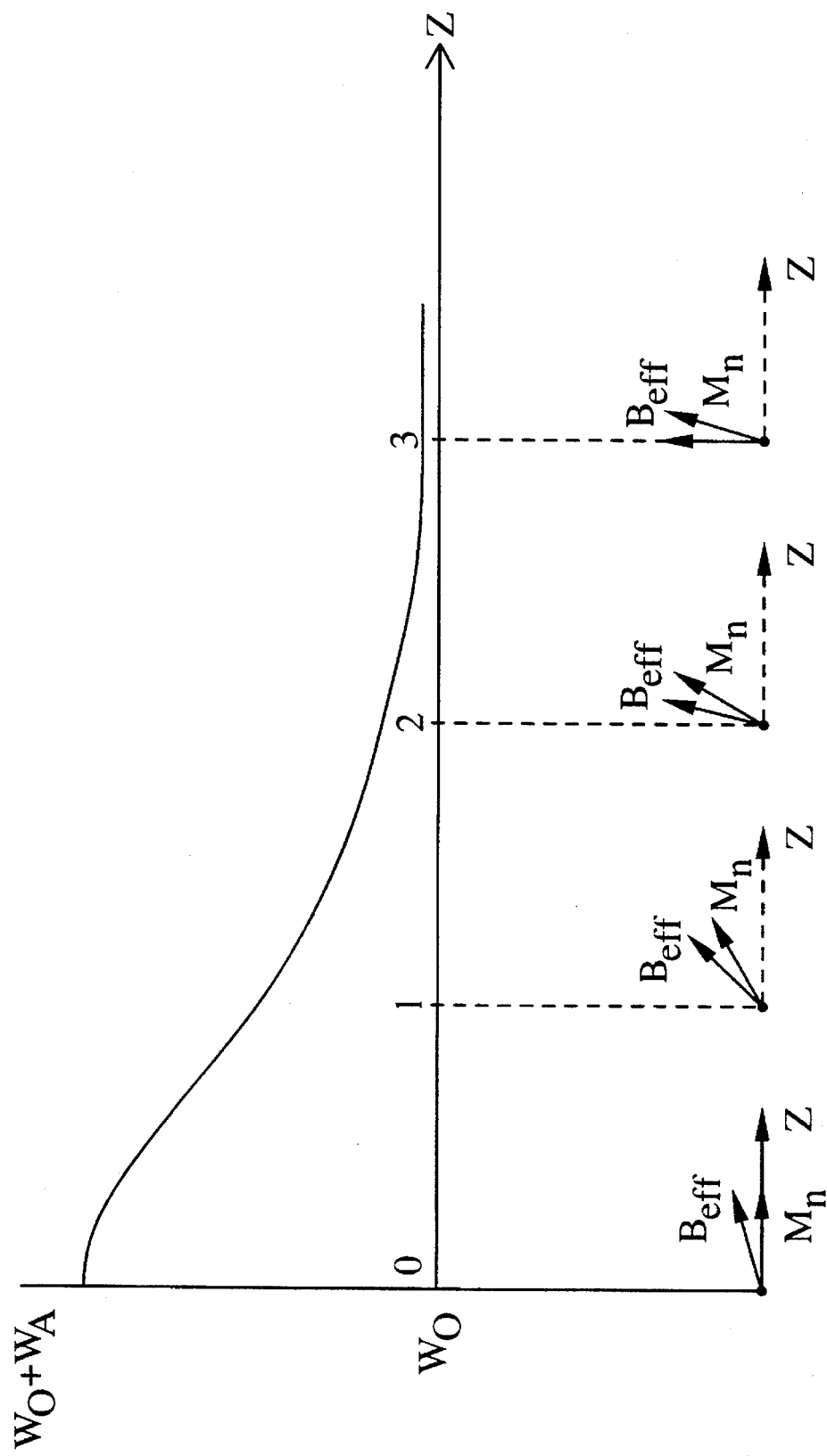
FIG. 4 shows the changes of the effective field due to the motion of nuclei

During the period TSW presented in the FIG. 3a the magnetization $M_n$ of the population of nuclei turns with the effective field in the direction of the z-axis. During the period $T_{AHP}$ the magnetization of the static tissue in the imaging volume has completely vanished, therefore the signal is emitted only by those nuclei which have proceeded from the heart to the imaging volume and experienced the adiabatic half passage. In this way one achieves a superior contrast between flowing and static tissues. In order to reach the necessary level of the signal-to-noise ratio and a high enough resolution the described operations are to be repeated during the next operational cycle of the heart.

As a summary the advantages gained via an use of the invention may be listed:

1. The method provides as good contrast between moving and static tissue as is practically possible: The static tissue is not visible in the final image.

2. The method is simple to apply and requires only minor changes in the MRI units.

3. The signal-to-noise ratio provided by the sequence is optimal, as a substantial part of the examination time may be exploited for the imaging procedures and the magnetization of the moving material is not saturated at all.

4. As the imaging methods those methods may be exploited which are less sensitive e.g. to turbulence of flow and the imaging procedures may be synchronized to the moment as the rate of the flow is as small as possible.

Just one embodiment of the invention has been described in the above specification.

I claim:

1. A magnetic resonance imaging method for the examination of material moving from a first area of an object under examination to an area of the object to be examined, the object containing stationary material, said method comprising the steps of:

applying a main magnetic field $B_o$ along an axis of the object under examination;

applying an auxiliary magnetic field $B_a$ along the main magnetic field axis and over the first area, said auxiliary magnetic field being strongest over the first area and weakening non-linearly along the main magnetic field axis toward the area of the object to be examined;

applying a first radio frequency pulse for at least a portion of the time said auxiliary magnetic field $B_a$ is applied, said radio frequency pulse at the Larmor frequency corresponding to the strength of the main magnetic field $B_o$, the length of said pulse corresponding in time for the material to move from the first area to at the area to be examined, the combination of the application of said non-linear auxiliary magnetic field and said first radio frequency pulse resulting in an adiabatic half passage sweep of the moving material and saturation of the stationary material in the area to be examined; and obtaining an image of the area of the object to be examined using an imaging sequence.

2. The method according to claim 1 further comprising the step of applying a second radio frequency pulse after the first radio frequency pulse for tilting the transverse nuclear magnetization in the area to be examined in order to generate a longitudinal magnetization.

3. The method according to claim 1 further comprising the step of synchronizing the operations required by the method with the changes of the rate of the movement of material.

4. The method according to claim 2 further comprising the step of synchronizing the operations required by the method with the changes of the rate of the movement of material.

5. A magnetic resonance imaging method for the examination of material moving from a first area of an object under examination to an area of the object to be examined, the object containing stationary material, said method comprising the steps of:

applying a main magnetic field $B_o$ along an axis of the object under examination;

applying an auxiliary magnetic field $B_a$ along the main magnetic field axis and over the first area, said auxiliary magnetic field being strongest over the first area, the strength of the auxiliary magnetic field varying non-linearly along the main magnetic field axis toward the area of the object to be examined;

applying a first radio frequency pulse for at least a portion of the time said auxiliary magnetic field $B_a$ is applied, said radio frequency pulse at substantially the Larmor frequency corresponding to the strength of the magnetic field at the area to be examined, the length of said pulse corresponding in time for the material to move from the first area to at the area to be examined, the combination of the application of said non-linear auxiliary magnetic field and said first radio frequency pulse resulting in an adiabatic half passage sweep of the moving material and saturation of the stationary material in the area to be examined; and obtaining an image of the area of the object to be examined using an imaging sequence.

6. The method of claim 5 wherein the auxiliary magnetic field progressively weakens along the main magnetic field axis toward the area of the object to be examined.

7. The method according to claim 5 further comprising the step of applying a second radio frequency pulse after the first radio frequency pulse for tilting the transverse nuclear magnetization in the area to be examined in order to generate a longitudinal magnetization.

8. The method according to claim 5 further comprising the step of synchronizing the operation required by the method with the changes of the rate of movement of the material.

9. The method according to claim 7 further comprising the step of synchronizing the operation required by the method with the changes of the rate of movement of the material.

* * * * *